United States Patent
Iorga

(10) Patent No.: US 7,123,075 B2
(45) Date of Patent: Oct. 17, 2006

(54) CURRENT MIRROR COMPENSATION USING CHANNEL LENGTH MODULATION

(75) Inventor: Cosmin Iorga, Oak Park, CA (US)

(73) Assignee: Teradyne, Inc., Boston, MA (US)

( * ) Notice: Subject to any disclaimer, the term of this patent is extended or adjusted under 35 U.S.C. 154(b) by 0 days.

(21) Appl. No.: 10/671,754

(22) Filed: Sep. 26, 2003

(65) Prior Publication Data

US 2005/0068072 A1   Mar. 31, 2005

(51) Int. Cl.
*G05F 1/10*   (2006.01)

(52) U.S. Cl. .................. 327/530; 330/288; 323/316

(58) Field of Classification Search ........... 327/530, 327/538–541, 543; 330/288; 323/315, 316
See application file for complete search history.

(56) References Cited

U.S. PATENT DOCUMENTS

| | | | |
|---|---|---|---|
| 4,990,864 A * | 2/1991 | Kwan .................... | 330/288 |
| 5,045,772 A | 9/1991 | Nishiwaki | |
| 5,675,280 A * | 10/1997 | Nomura et al. ........... | 327/538 |
| 5,691,658 A * | 11/1997 | Klein .................... | 327/104 |
| 5,873,053 A | 2/1999 | Pricer et al. | |
| 5,939,933 A * | 8/1999 | Wang .................... | 327/512 |
| 6,051,999 A | 4/2000 | To et al. | |
| 6,066,944 A | 5/2000 | Sakurai | |
| 6,107,868 A | 8/2000 | Diniz et al. | |
| 6,133,749 A * | 10/2000 | Hansen et al. .............. | 326/30 |
| 6,201,435 B1 | 3/2001 | Chou | |
| 6,323,695 B1 * | 11/2001 | Heinrich .................. | 327/89 |
| 6,388,507 B1 | 5/2002 | Hwang et al. | |
| 6,448,811 B1 | 9/2002 | Narendra et al. | |
| 6,459,326 B1 * | 10/2002 | Descombes ............... | 327/513 |
| 6,462,527 B1 * | 10/2002 | Maneatis ................. | 323/315 |
| 6,472,921 B1 | 10/2002 | Rao et al. | |
| 6,566,851 B1 | 5/2003 | Schuelke et al. | |
| 6,737,909 B1 | 5/2004 | Jaussi et al. | |
| 6,023,185 A1 | 1/2005 | Galipeau et al. | |
| 6,850,049 B1 * | 2/2005 | Kono ..................... | 323/315 |
| 6,914,457 B1 | 7/2005 | Confalonieri et al. | |
| 2004/0061527 A1 | 4/2004 | Knee | |

FOREIGN PATENT DOCUMENTS

| | | |
|---|---|---|
| EP | 0239989 | 10/1987 |
| EP | 0289989 | 10/1987 |
| EP | 1187331 | 3/2002 |

* cited by examiner

*Primary Examiner*—Kenneth B. Wells
(74) *Attorney, Agent, or Firm*—Daly, Crowley, Mofford & Durkee, LLP

(57) ABSTRACT

A current compensation circuit for use with a current mirror circuit is disclosed. The current mirror circuit has a current path defined by a first programmable current mirror stage driving a first fanout current mirror stage. The first programmable current mirror stage includes at least one transistor with a channel length exhibiting a first channel length modulation factor $\lambda 1$. The first fanout current mirror stage connects to a supply voltage source. The current compensation circuit comprises a supply voltage current mirror coupled to the supply voltage source and has a current output coupled to the current path. The compensation circuit further includes a second programmable current mirror coupled in series to the supply voltage current mirror and including at least one transistor with a channel length exhibiting a channel length modulation factor $\lambda 2$. The second channel length modulation factor $\lambda 2$ is larger than the first channel length modulation factor $\lambda 1$. As a result, the first programmable current mirror and the second programmable current mirror cooperate to maintain a bias current through the first fanout current mirror stage substantially independent of changes in the supply voltage.

10 Claims, 4 Drawing Sheets

CURRENT MIRROR COMPENSATION USING CHANNEL LENGTH MODULATION

TECHNICAL FIELD

The circuitry described herein relates generally to automatic test equipment, and more particularly low jitter timing generation circuits for automatic test equipment applications.

BACKGROUND

Timing edge placement is often a critical parameter for high performance semiconductor testers. Having the ability to place the rising and/or falling edge of a test signal within a few picoseconds of a desired point in time may mean the difference in passing or failing large numbers of semiconductor devices under test.

Conventional timing generators that produce high accuracy timing signals are often employed in complementary metal-oxide-semiconductor (CMOS) integrated circuits (ICs). CMOS technology provides relatively good performance at very low cost. However, CMOS ICs are often susceptible to temperature and other conditions that affect the performance of the circuit. To counter this, many CMOS timing generators employ sophisticated compensation techniques to minimize changes in delay.

With reference to FIG. 1, a conventional CMOS timing generator 10 that provides for temperature compensation typically includes a plurality of delay elements D1–DN coupled together to form a delay line. Each of the delay element outputs serve as timing selection inputs to a timing signal selector (not shown). The same outputs are also used for a delay compensation scheme. A compensation multiplexer 12 is employed, that receives the delay outputs, and provides an output to a phase detector 14, where it is compared to a reference signal Vref to determine any phase difference. A compensation voltage is then generated in response to the magnitude of any phase difference, and fed to a charge pump or voltage-to-current converter 16. The current generated by the converter is provided as a reference bias current to a bias current fanout circuit 18 that duplicates and distributes bias current to the delay elements to control the delay.

To fanout, or distribute the bias current to the various delay elements, a current mirror circuit scheme is typically employed. As shown in FIG. 2, a conventional current mirror includes a reference current source 19 coupled to a current source transistor $Q_S$ to generate the same current through a first mirror transistor $Q_{FM}$. The mirror transistor's gate is tied to its drain, with its source terminal coupled to the supply voltage $V_{DD}$. A plurality of mirroring transistors $Q_{FM2}$–$Q_{FMN}$ are disposed in parallel, each with its gate tied to the first mirror transistor gate, and source terminals tied to $V_{DD}$.

While this configuration works well for its intended applications, the current through each mirror transistor may be susceptible to noise components acting on the $V_{DD}$ bus. Even a relatively small change of 100 millivolts can cause a corresponding change in the bias current through each mirror, correspondingly affecting the level of current provided therefrom. As voltage levels on integrated circuits continue to decrease, this problem becomes more pronounced.

What is needed and currently unavailable is a compensation circuit for use with current mirror circuits to minimize changes in current attributable to supply voltage noise. The current mirror compensation circuit described herein satisfies this need.

SUMMARY

The current mirror compensation circuit described herein provides a low-jitter solution for the generation of bias currents by one or more current mirrors. By minimizing the errors attributable to noise in the supply voltage, reduced supply voltage levels may be employed in integrated circuits with little error caused by the current mirror circuitry.

To realize the foregoing advantages, the circuit in one form comprises a current compensation circuit for use with a current mirror circuit. The current mirror circuit has a current path defined by a first programmable current mirror stage driving a first fanout current mirror stage. The first programmable current mirror stage includes at least one transistor with a channel length exhibiting a first channel length modulation factor $\lambda 1$. The first fanout current mirror stage connects to a supply voltage source. The current compensation circuit comprises a supply voltage current mirror coupled to the supply voltage source and has a current output coupled to the current path. The compensation circuit further includes a second programmable current mirror coupled in series to the supply voltage current mirror and including at least one transistor with a channel length exhibiting a channel length modulation factor $\lambda 2$. The second channel length modulation factor $\lambda 2$ is larger than the first channel length modulation factor $\lambda 1$. As a result, the first programmable current mirror and the second programmable current mirror cooperate to maintain a bias current through the first fanout current mirror stage substantially independent of changes in the supply voltage.

In another form, the circuit comprises a timing generator for use in a semiconductor tester. The timing generator includes a delay line having a plurality of delay cells with respective phase-shifted outputs and bias current inputs. A selector with a plurality of inputs receives the phase shifted outputs, and includes an output. Phase detection circuitry detects the phase shift between the selector output and a reference signal, and generates bias current. The timing generator further includes means for distributing the bias current to the plurality of delay cells.

Other features and advantages of the present invention will be apparent from the following detailed description when read in conjunction with the accompanying drawings.

BRIEF DESCRIPTION OF THE DRAWINGS

The circuit described herein will be better understood by reference to the following more detailed description and accompanying drawings in which.

DETAILED DESCRIPTION

The current mirror compensation circuit described herein, generally designated 50, provides a unique solution for addressing the undesirable effects of a changing supply voltage in high performance CMOS timing generators. This is accomplished by feeding compensation current to bias current generated by fanout circuitry 30. The compensation current offsets any changes to the bias current resulting from any changes in $V_{DD}$ caused by noise or jitter. By minimizing the effects of a changing $V_{DD}$, changes to the delay characteristics of the cell are also correspondingly minimized.

Figure 1:
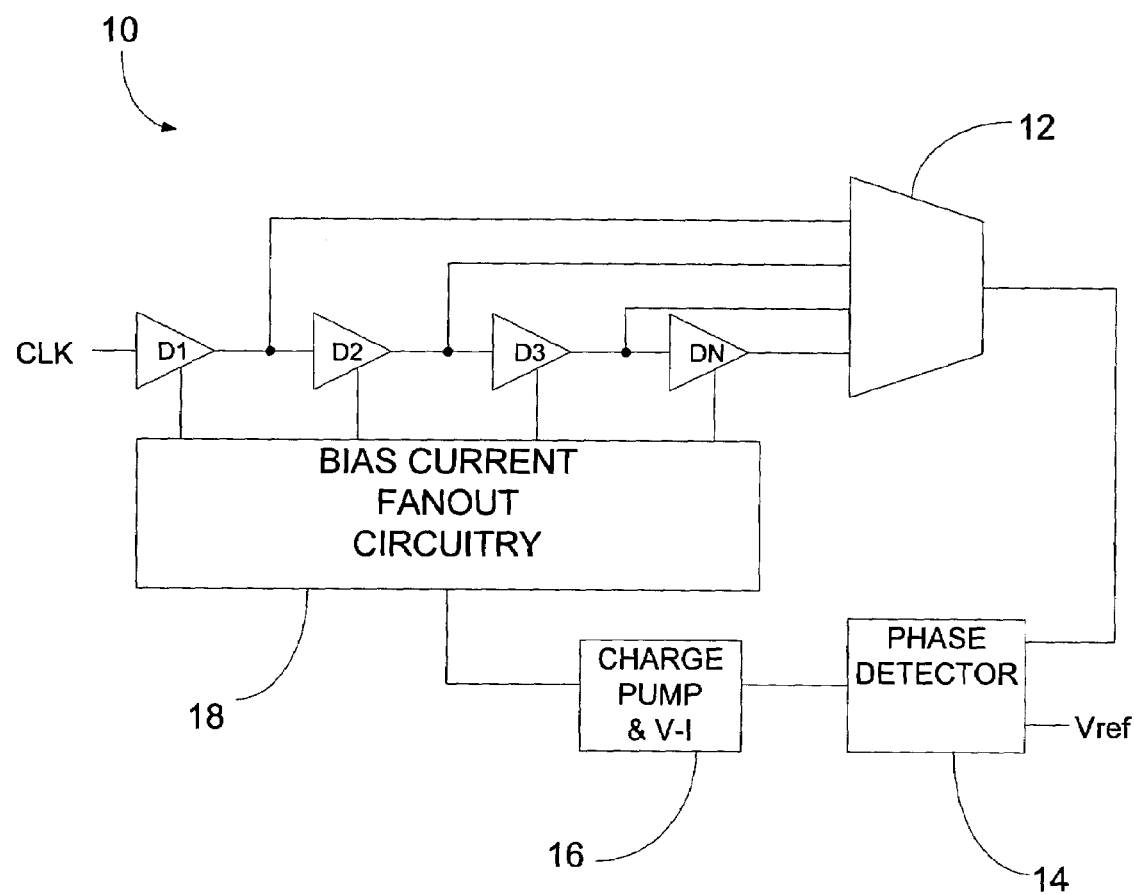
FIG. 1 is a high-level block diagram of a conventional timing generator.
Figure 2:
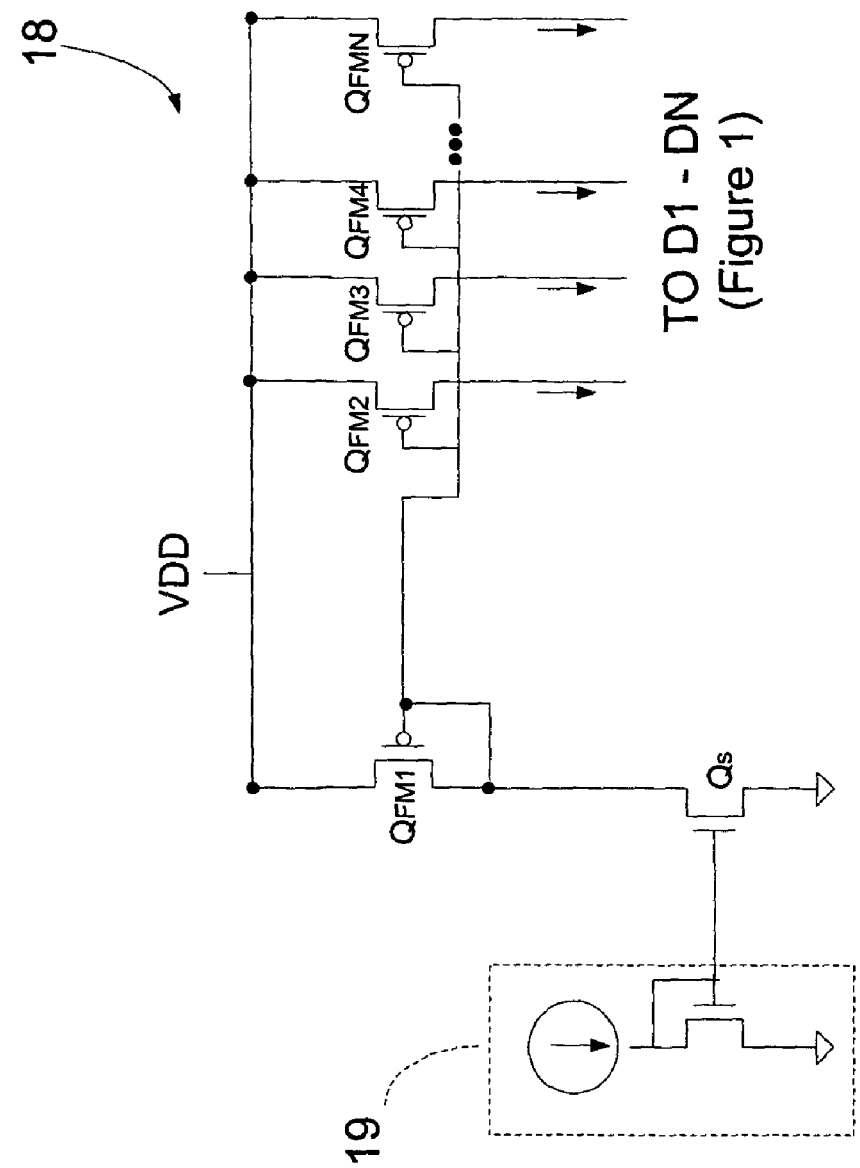
FIG. 2 is a partial schematic view of the conventional bias current fanout circuitry employed in the timing generator of FIG. 1.
Figure 3:
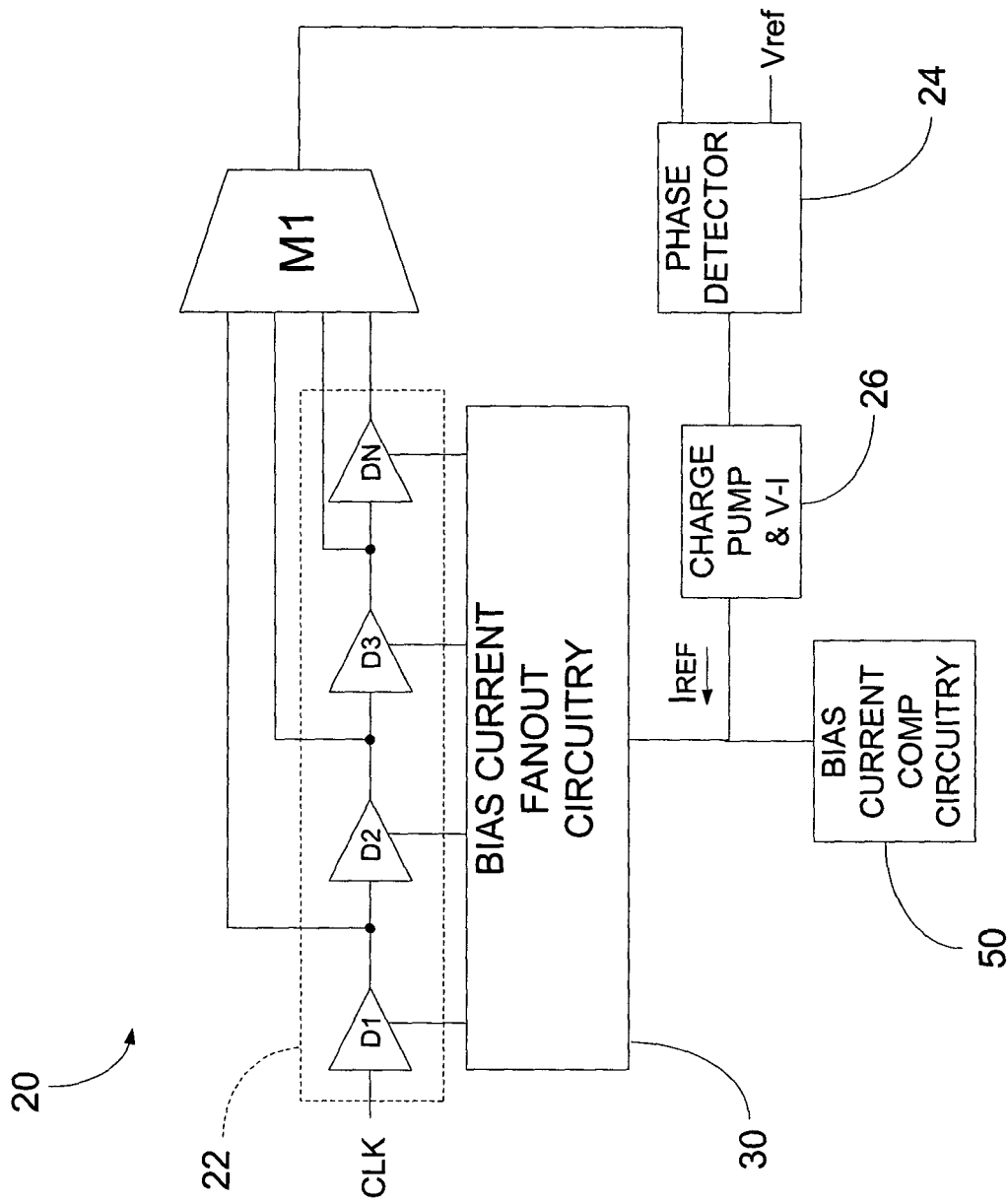
FIG. 3 is a high-level block diagram of a timing generator according to one form of the circuit described herein.

Referring now to FIG. 3, a timing generator that employs the current mirror compensation circuit, generally designated 20, is shown. The timing generator is of the type that provides bias current compensation to control delay. The generator includes a delay line 22 comprising a set of N delay elements D1–DN, each providing a proportional to 1/N phase offset with respect to an input clock CLK. A preferred delay element construction that provides low jitter delay is described in co-pending patent application Ser. No. 10/376,664, titled "Low Jitter Delay Cell", filed Feb. 28, 2003, assigned to the assignee of the present invention, and expressly incorporated by reference herein.

Further referring to FIG. 3, the delay element outputs are fed to a selector, or multiplexer M1. The multiplexer output feeds a phase detector 24 that determines the phase difference between the selected delay signal (presented by the multiplexer) and a reference signal $V_{ref}$. A charge pump and voltage-to-current converter 26 receives a difference signal from the phase detector to generate a reference bias current $I_{REF}$. The reference bias current is then duplicated and distributed by fanout circuitry 30 to provide the bias current for the delay elements. The change in bias current serves to control the delay through each element to a desired level.

Figure 4:
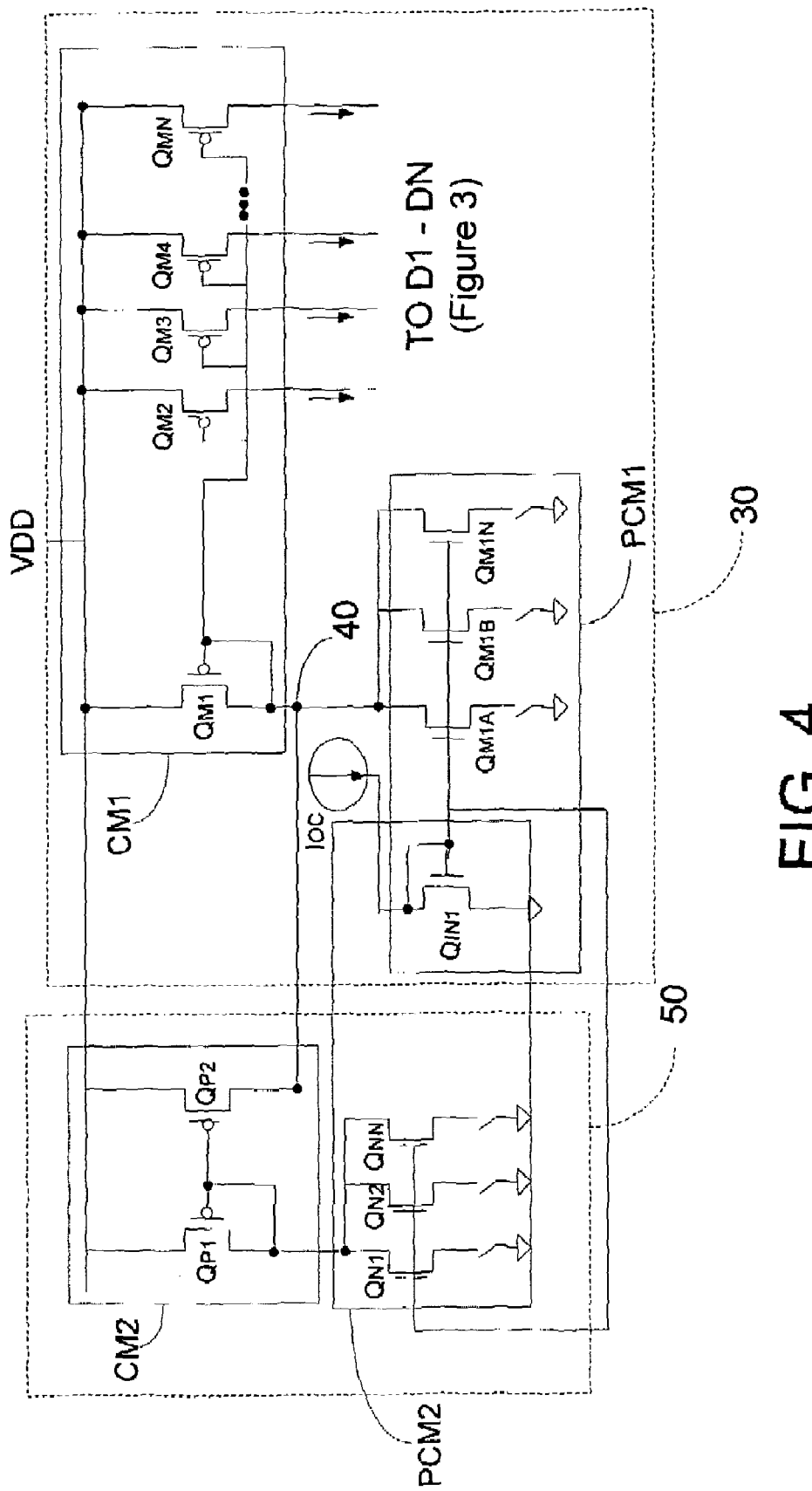
FIG. 4 is a high-level block diagram of a bias current source for use in the timing generator of FIG. 3.

Referring now to FIG. 4, the fanout circuitry 30 generally includes a first programmable current mirror PCM1. PCM1 includes a reference current source input transistor QIN1 that receives an off-chip current IOC to generate a bias voltage for a first programmable current mirror PCM1. PCM1 also includes in the form of a current DAC, or IDAC transistors QM1A–QM1N. Each of the OM1A–OM1N transistors has a relatively long channel length, on the order of around 720 nanometers. As is well understood in the art, the current DAC comprises a bank of transistors that are selectively activated to achieve desired characteristics.

With continued reference to FIG. 4, A fanout current mirror CM1 includes transistors QM1–QMN. The transistors QM1A–QM1N are disposed in series with transistor QM1, forming a node at 40. While not explicitly shown in FIG. 4, the voltage-to-current converter output (FIG. 3) is connected to node 40. The transistor QM1 has its gate tied to the gates of transistors QM2–QMN. Because of the respective gate-to-source connections for each transistor, the current through QM1 is duplicated en masse through transistors QM2–QMN. The duplicated currents are then fed as bias currents to the delay cells, or groups of delay cells.

For optimum control over the bias current, and to minimize the effects from undesirable changes on the supply voltage VDD, the fanout circuitry 30 includes an input, at node 40, for receiving compensation current from the current mirror compensation circuit 50.

Referring again to FIG. 4, the current mirror compensation circuit 50 comprises a supply voltage detector having a supply voltage current mirror CM2 coupled to a second programmable current mirror PCM2. In the overall preferred implementation, the entire fanout and compensation circuitry is disposed on a single CMOS integrated circuit.

The supply voltage current mirror CM2 includes a diode-connected p-channel MOSFET $Q_{P1}$ with a source terminal coupled to the $V_{DD}$ supply rail. The drain terminal of transistor $Q_{P1}$ provides a series connection to the second programmable current mirror PCM2. A second p-channel MOSFET $Q_{P2}$ is configured to have a gate-to-source voltage duplicating that of $Q_{P1}$, thus mirroring the current, which comprises the compensation current into node 40.

PCM2 includes transistors QIN1 and QN1–QNN. The construction of the transistors QN1–QNN is similar to the transistors QM1A–QM1N, but transistors QN1–QNN exhibit channel lengths for each transistors that are relatively short (for example, approximately 120 nanometers). In relative terms, the channel lengths for the transistors QN1–QNN transistors are on the order of ⅕ the length of the QM1A–QM1N transistors. This relationship may also be expressed in terms of a channel length modulation factor $\lambda$, the channel length modulation factor is inversely proportional to the channel length. Thus, the channel length modulation factor for the QN1–QNN transistors $\lambda2$ is greater than the channel length factor of QM1A–QM1N transistors $\lambda1$. The effect of this relative difference in the channel length modulation factor between the QM1A–QM1N and the QN1–QNN transistors is explained more specifically below.

In operation, the accuracy of the timing generator 20 (FIG. 3) depends upon the accuracy of the individual delays associated with each delay cell DN. The individual delays are each regulated by the bias current running through each cell DN. Bias current is drawn through each cell and is programmed by the user to achieve the desired delay for the cell. Generally, a higher bias current results in a shorter delay, while a lower bias current increases the delay. The bias voltage for the cell is provided by the $V_{DD}$ bus, generally on the order of 1.2 volts. However, noise often affects the value of $V_{DD}$, sometimes increasing or decreasing the level by +/−0.10 volts.

Where a noisy $V_{DD}$ affects the bias current produced by the fanout circuitry 30, the compensation current circuit 50 offsets the effect by sinking or sourcing appropriate levels of current into the input node 40 (FIG. 4). In the instance where too much current is being drawn through the first fanout current mirror CM1 because of a higher supply voltage $V_{DD}$ due to noise, the compensation circuit 50 sources more current (due to the short channel effect) into the node 40, causing transistor $Q_{M1}$ to supply correspondingly less current, while the first programmable current mirror PCM1 (transistor $Q_{M1}$) still draws its required current. In the instance where too little current is drawn through transistor $Q_{M1}$, the compensation circuit sources less current, forcing $Q_{M1}$ to provide additional current, which is duplicated through mirror transistors $Q_{M2}$–$Q_{MN}$. The programmability aspect of the current mirror compensation circuit allows for fine tuning the compensation current, as necessary.

During operation, the level of compensation current supplied by the compensation circuit 50 varies with the user-controlled settings of the respective programmable current mirrors PCM1 and PCM2. If a constant bias current through fanout current mirror CM1 of, for example 100 microamps, is desired, the second programmable current source can be programmed to source 400 microamps of current in response to a detected change in the supply voltage VDD. This detection results from a change in the gate-to-source voltage on the supply voltage current mirror CM2. The first programmable current source PCM1 would then be programmed to sink 500 microamps, resulting in a net required current through fanout mirror CM1 at node 40, of 100 microamps. Dynamic changes in the supply voltage VDD cause corresponding dynamic changes in the current from the respective programmable current sources PCM1 and PCM2, thus preserving a constant relative difference for duplication by the fanout circuitry 30.

Those skilled in the art will appreciate the benefits and advantages afforded by the circuit described herein. Of significant importance is the current compensation feature that offsets bias current inaccuracies caused by undesirable noise acting on the supply voltage. Further, the programmable nature of the circuit provides flexibility and accuracy in allowing for fine-tuning of the compensation current. Moreover, due to the circuit's convenient construction, it is readily adaptable for use as a standard cell block.

It will also be appreciated that the current mirror compensation circuit described herein is not limited solely to the field of automatic test equipment (ATE). While ATE presents a challenging environment where such a circuit provides a substantial beneficial impact, any application where current mirroring techniques are employed may benefit from the use of this circuit. For example, circuits that employ analog-to-digital conversion techniques or where current generates a reference voltage may use the compensation circuit. These applications are likely to use current mirroring techniques with reduced supply voltages.

While the invention has been particularly shown and described with reference to the preferred embodiments thereof, it will be understood by those skilled in the art that various changes in form and detail may be made therein without departing from the spirit and scope of the invention.

What is claimed is:

1. A circuit comprising:
a supply voltage current minor configured to be coupled to a supply voltage source, and comprising a current output configured to be coupled to a node; the node coupling a fanout current mirror and a first programmable current minor, the first programmable mirror having a first transistor having a first channel length modulation factor $\lambda 1$; and
a second programmable current mirror coupled to the supply voltage current mirror and comprising a second transistor having a second channel length modulation factor $\lambda 2$, the second channel length modulation factor $\lambda 2$ being larger than the first channel length modulation factor $\lambda 1$, the second programmable current mirror being configured to maintain, with the first programmable current mirror, a bias current through the fanout current mirror substantially independent of voltage changes in the supply voltage source.

2. The circuit of claim 1 wherein the first programmable current mirror comprises a parallel array of programmable transistors for defining a predetermined range of current.

3. The circuit of claim 1 wherein the circuit is formed on a single integrated circuit device.

4. The circuit of claim 3 wherein the circuit is formed using complementary metal-oxide- semiconductor technology.

5. A method for compensating for supply-voltage-induced changes to a desired current through a fanout current mirror, the method comprising:
detecting changes in the voltage from a supply voltage source;
generating a compensation current to a current path node, the compensation current representative of the voltage changes in the supply voltage source, the compensation current based on the channel length modulation factor $\lambda 2$ of a second programmable current source; and
sinking current from the current path node with a first programmable current source having a first channel length modulation factor $\lambda 1$, $\lambda 1$ being less than $\lambda 2$, wherein the level of current sunk corresponds to the difference between the compensation current and the desired current through the fanout current mirror.

6. A circuit, comprising:
a current mirror circuit, the current mirror circuit comprising:
a first programmable current mirror and a fanout current mirror coupled to the first programmable current mirror by a node, the first programmable current mirror comprising a first transistor having a first channel length modulation factor $\lambda 1$, the fanout current mirror coupled to a supply voltage source, and
a current compensation circuit; the current compensation circuit comprising:
a supply voltage current mirror coupled to the supply voltage source and comprising a current output coupled to the node; and
a second programmable current mirror coupled to the supply voltage current mirror comprising a second transistor with a second channel length modulation factor $\lambda 2$, the second channel length modulation factor $\lambda 2$ being larger than the first channel length modulation factor $\lambda 1$, the first programmable current mirror and the second programmable current mirror cooperating to maintain a bias current through the fanout current mirror substantially independent of voltage changes in the supply voltage source.

7. The circuit of claim 6 wherein the first programmable current mirror comprises a parallel array of programmable transistors for defining a predetermined range of current.

8. The circuit of claim 6 wherein the second programmable current mirror comprises a parallel array of programmable transistors for defining a predetermined range of current.

9. The circuit of claim 6 wherein the circuit is formed on a single integrated circuit device.

10. The circuit according to claim 6 wherein the circuit is formed using a complementary metal-oxide-semiconductor.

* * * * *